United States Patent
Khlat

(10) Patent No.: US 10,432,145 B2
(45) Date of Patent: Oct. 1, 2019

(54) ENVELOPE TRACKING CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/966,378

(22) Filed: Apr. 30, 2018

(65) Prior Publication Data

US 2019/0222181 A1 Jul. 18, 2019

Related U.S. Application Data

(60) Provisional application No. 62/617,388, filed on Jan. 15, 2018.

(51) Int. Cl.
| | |
|---|---|
| H03F 3/19 | (2006.01) |
| H03F 1/02 | (2006.01) |
| G01R 1/30 | (2006.01) |
| H03F 3/189 | (2006.01) |
| H03F 3/20 | (2006.01) |

(52) U.S. Cl.
CPC ............ *H03F 1/0227* (2013.01); *G01R 1/30* (2013.01); *H03F 3/189* (2013.01); *H03F 3/19* (2013.01); *H03F 3/20* (2013.01); *H03F 2200/102* (2013.01); *H03F 2200/336* (2013.01); *H03F 2200/451* (2013.01)

(58) Field of Classification Search
CPC ........ H03F 3/19; H03F 3/20; H03F 2200/102; H03F 2200/336; H03F 2200/451
USPC ....................................................... 375/297
See application file for complete search history.

(56) References Cited

U.S. PATENT DOCUMENTS

| | | | |
|---|---|---|---|
| 6,157,253 A | 12/2000 | Sigmon et al. | |
| 2011/0151806 A1* | 6/2011 | Kenington | ............... H01Q 3/28 455/101 |
| 2011/0241773 A1 | 10/2011 | Fisk et al. | |
| 2012/0068767 A1 | 3/2012 | Henshaw et al. | |
| 2015/0372646 A1 | 12/2015 | Briffa et al. | |

(Continued)

OTHER PUBLICATIONS

Non-Final Office Action for U.S. Appl. No. 15/966,329, dated Sep. 7, 2018, 9 pages.

(Continued)

*Primary Examiner* — Michael R Neff
(74) *Attorney, Agent, or Firm* — Withrow & Terranova, P.L.L.C.

(57) ABSTRACT

An envelope tracking (ET) circuit is provided. In the ET circuit, a number of amplifier circuits are configured to amplify a radio frequency (RF) signal simultaneously to generate multiple RF transmit signals for transmission in a formed RF beam. The RF signal is pre-modulated into respective phase and amplitude terms such that the multiple RF transmit signals can be linearly combined at a receiver(s). A signal processing circuit is configured to determine a combined distortion term in the multiple RF transmit signals. Accordingly, the signal processing circuit pre-distorts the RF signal with a distortion correction term to offset the combined distortion term in the RF transmit signals. By introducing the distortion correction term in the RF signal, it is possible to restore linear coherency among the RF transmit signals without compromising efficiency and/or increasing heat dissipation of the amplifier array(s).

20 Claims, 8 Drawing Sheets

(56) References Cited

U.S. PATENT DOCUMENTS

2016/0099686 A1  4/2016  Perreault et al.
2018/0152144 A1  5/2018  Choo et al.

OTHER PUBLICATIONS

Final Office Action for U.S. Appl. No. 15/966,329, dated Feb. 19, 2019, 11 pages.
Non-Final Office Action for U.S. Appl. No. 15/966,329, dated May 30, 2019, 10 pages.

* cited by examiner

ENVELOPE TRACKING CIRCUIT

RELATED APPLICATIONS

This application claims the benefit of provisional patent application Ser. No. 62/617,388, filed Jan. 15, 2018, the disclosure of which is hereby incorporated herein by reference in its entirety.

This application is related to U.S. patent application Ser. No. 15/966,329, filed Apr. 30, 2019, entitled "ENVELOPE TRACKING CIRCUIT," the disclosure of which is hereby incorporated herein by reference in its entirety.

FIELD OF THE DISCLOSURE

The technology of the disclosure relates generally to millimeter wave (mmWave) radio frequency (RF) power amplifier circuits.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

Fifth-generation (5G) new radio (NR) (5G-NR) wireless communication technology has been widely regarded as the next wireless communication standard beyond the current third-generation (3G) communication standard, such as wideband code division multiple access (WCDMA), and fourth-generation (4G) communication standard, such as long-term evolution (LTE). As such, a 5G-NR capable mobile communication device is expected to achieve significantly higher data rates, improved coverage range, enhanced signaling efficiency, and reduced latency compared to a conventional mobile communication device supporting only the 3G and 4G communication standards.

The 5G-NR capable mobile communication device can be configured to transmit an RF signal(s) in a millimeter wave (mmWave) radio frequency (RF) spectrum(s), such as a RF spectrum above 28 GHz. RF signals transmitted in the mmWave RF spectrum are susceptible to attenuation and interference. In this regard, the 5G-NR capable mobile communication device typically employs amplifier array and antenna array to shape the RF signal(s) into a directional RF beam(s) for transmission in the mmWave RF spectrum(s). Depending on the application scenarios supported by the 5G-NR capable mobile communication device, the amplifier array may be configured to include from tens to hundreds of power amplifiers. Notably, power amplifiers in the amplifier array can generate excessive heat when operating at suboptimal efficiency. As such, it may be desired to improve operating efficiency of the amplifier array to help reduce heat dissipation in the 5G-NR capable mobile communication device.

SUMMARY

Embodiments of the disclosure relate to an envelope tracking (ET) circuit. In the ET circuit, a number of amplifier circuits are configured to amplify a radio frequency (RF) signal simultaneously to generate multiple RF transmit signals for transmission in a formed RF beam. The RF signal is pre-modulated into respective phase and amplitude terms prior to being amplified by the amplifier circuits such that the multiple RF transmit signals transmitted in the formed RF beam can be linearly combined at a receiver(s). However, the pre-modulated phase and amplitude terms may be distorted in the RF transmit signals, thus compromising the receiver(s)' ability to reconstruct the RF signal received via the formed RF beam. As such, a signal processing circuit is configured to determine a combined distortion term in the multiple RF transmit signals. Accordingly, the signal processing circuit pre-distorts the RF signal with a distortion correction term to offset the combined distortion term in the RF transmit signals. By introducing the distortion correction term in the RF signal (e.g., prior to modulating the RF signal into the respective phase and amplitude terms), it is possible to restore linear coherency among the RF transmit signals without compromising efficiency and/or increasing heat dissipation of the amplifier array(s).

In one aspect, an ET circuit is provided. The ET circuit includes an amplifier array. The amplifier array includes a number of signal inputs configured to receive an RF signal modulated in a plurality of phase and amplitude terms, respectively. The amplifier array also includes a number of amplifier circuits coupled to the plurality of signal inputs and configured to amplify the RF signal modulated in the plurality of phase and amplitude terms to generate a plurality of RF transmit signals, respectively. The amplifier array also includes a number of signal outputs coupled to the plurality of amplifier circuits and configured to output the plurality of RF transmit signals, respectively. The ET circuit also includes a signal processing circuit coupled to the amplifier array. The signal processing circuit is configured to determine a combined distortion term of the plurality of RF transmit signals. The signal processing circuit is also configured to pre-distort the RF signal with a distortion correction term to offset the combined distortion term in the plurality of RF transmit signals.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
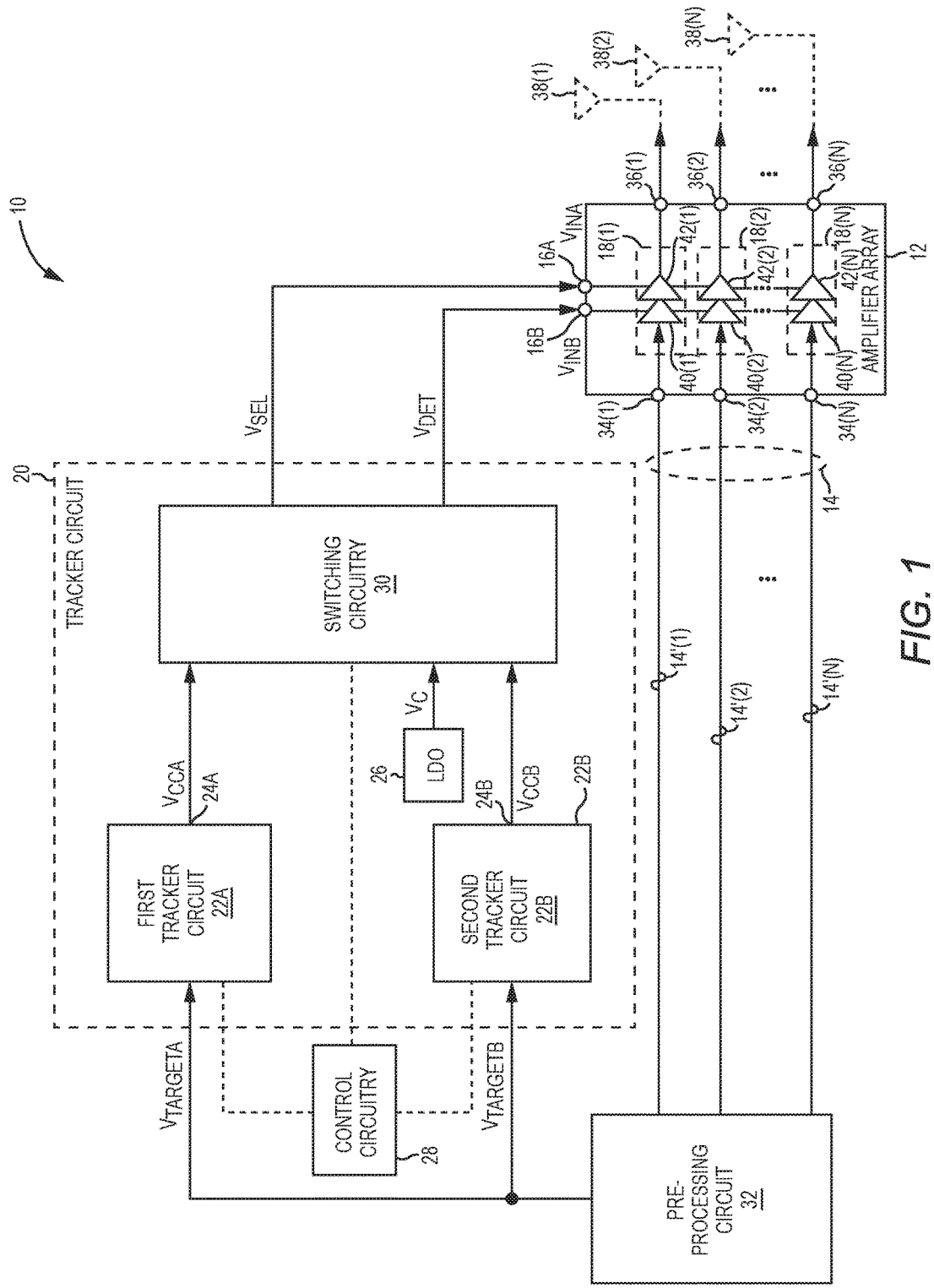
FIG. 1 is a schematic diagram of an exemplary millimeter wave (mmWave) envelope tracking (ET) circuit configured to support an amplifier array for amplifying a radio frequency (RF) signal in a wide range of modulation bandwidth.
Figure 7:
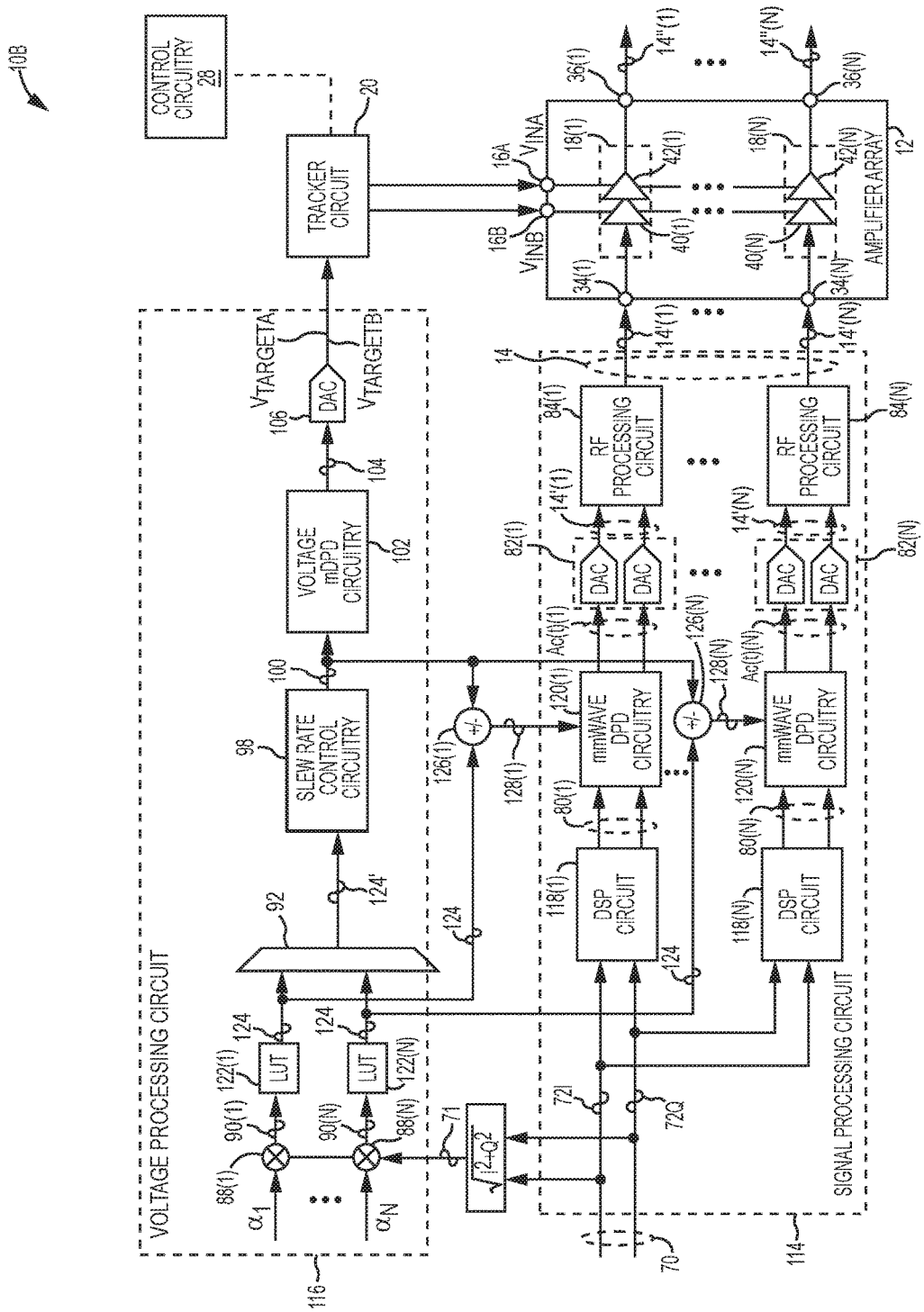
Figure 8:
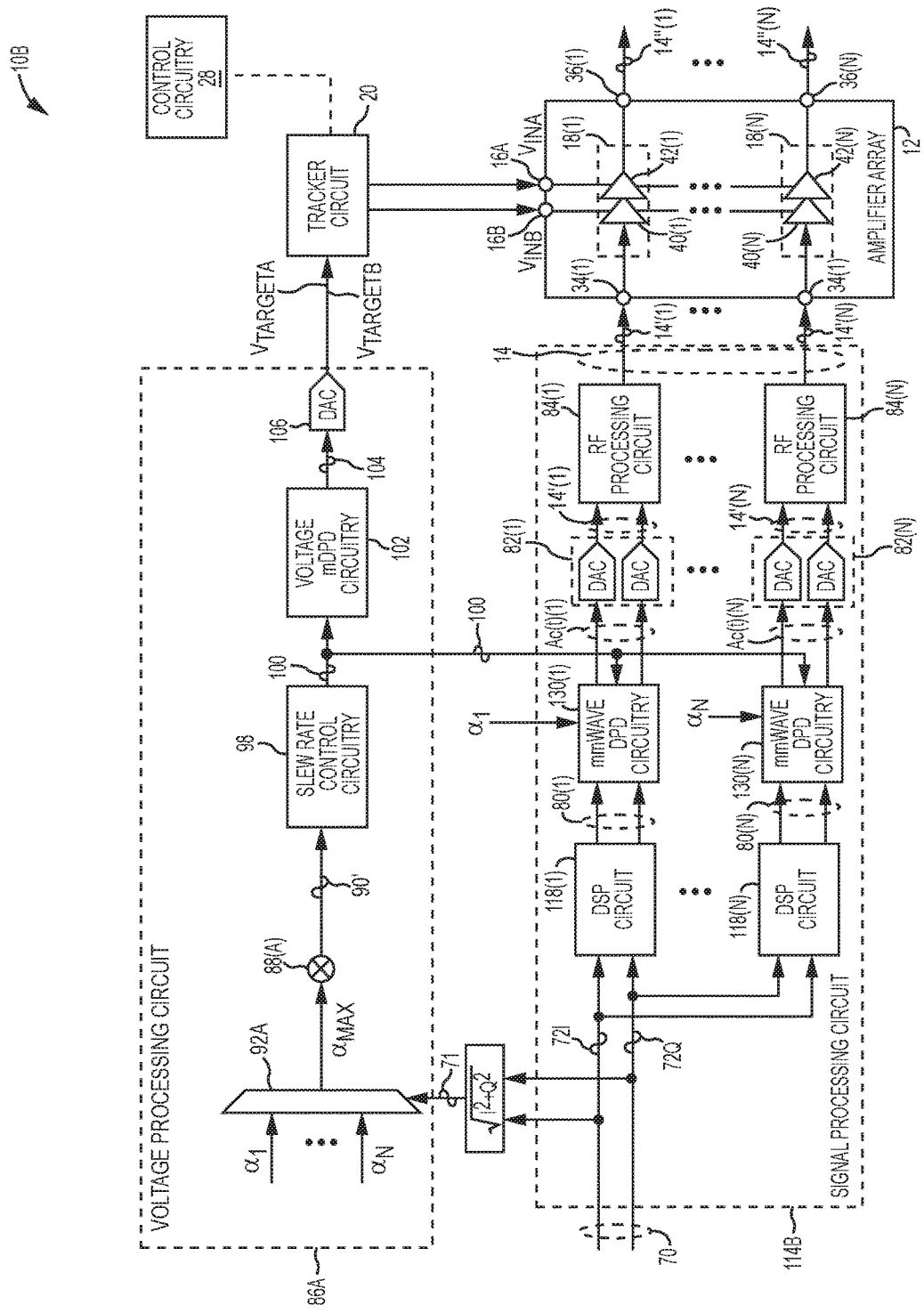

FIG. 7 is a schematic diagram of an exemplary mmWave ET circuit configured to reduce phase and amplitude distortions in the RF signal of FIG. 1 according to another embodiment of the present disclosure; and FIG. 8 is a schematic diagram of an exemplary mmWave ET circuit configured to reduce phase and amplitude distortions in the RF signal of FIG. 1 according to another embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to an envelope tracking (ET) circuit. The ET circuit includes an amplifier array(s) configured to amplify a radio frequency (RF) signal (s) based on a first input voltage and a second input voltage. The ET circuit includes a pair of tracker circuits each configured to generate a modulated voltage. The ET circuit includes control circuitry configured to couple a selected tracker circuit among the tracker circuits to provide a selected modulated voltage (e.g., ET modulated voltage) to the amplifier array(s) as the first input voltage. Depending on usage scenarios, the control circuitry also provides an ET modulated voltage, an average power tracking (APT) modulated voltage, or a constant voltage to the amplifier array(s) as the second input voltage. As such, the ET circuit can support the RF signal(s) modulated in a wide range of modulation bandwidth without compromising efficiency and/or increasing heat dissipation of the amplifier array(s).

Figure 2:
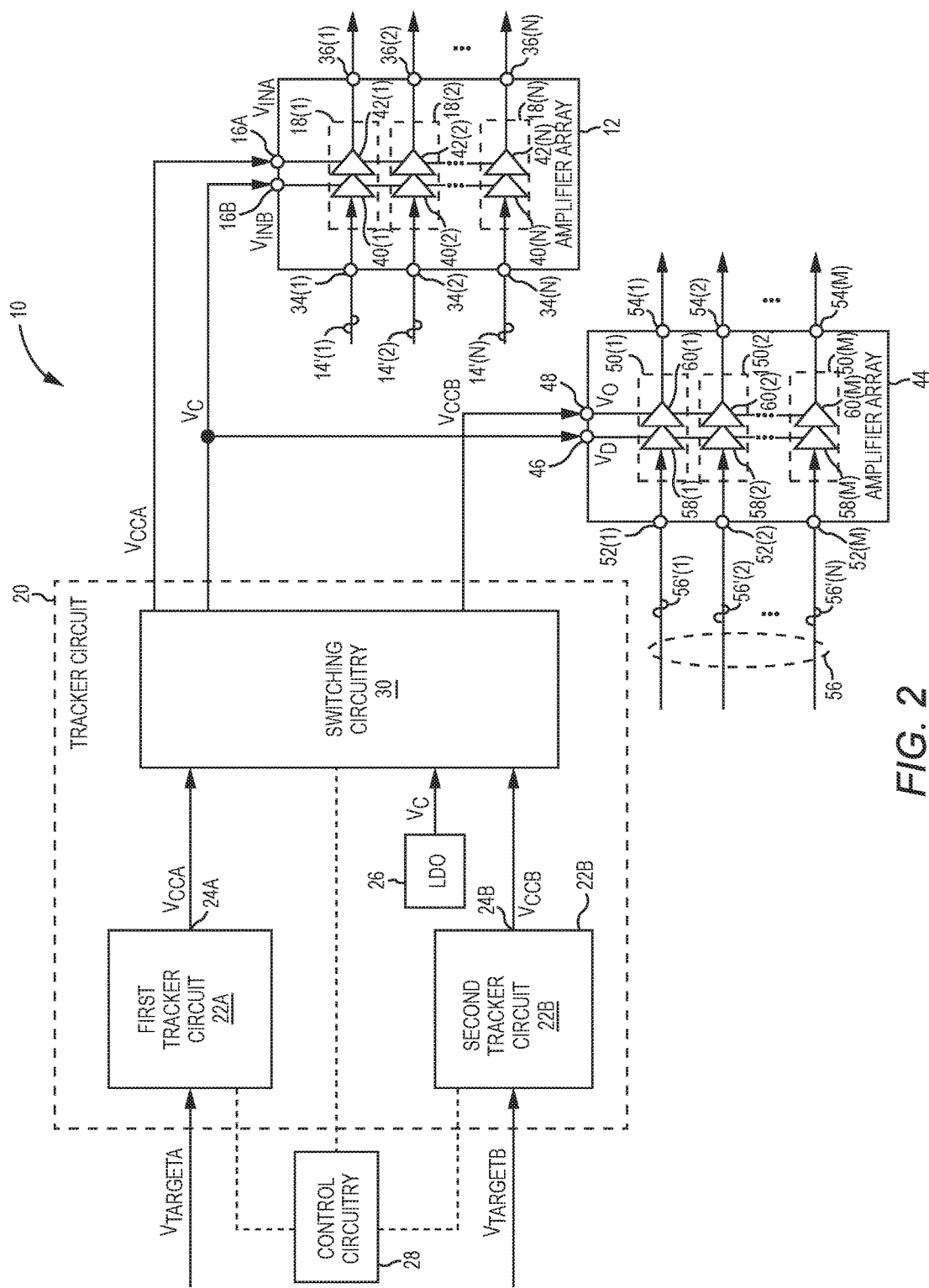
FIG. 2 is a schematic diagram of the mmWave ET circuit of FIG. 1 configured to support multiple antenna arrays according to one embodiment of the present disclosure.
Figure 3:
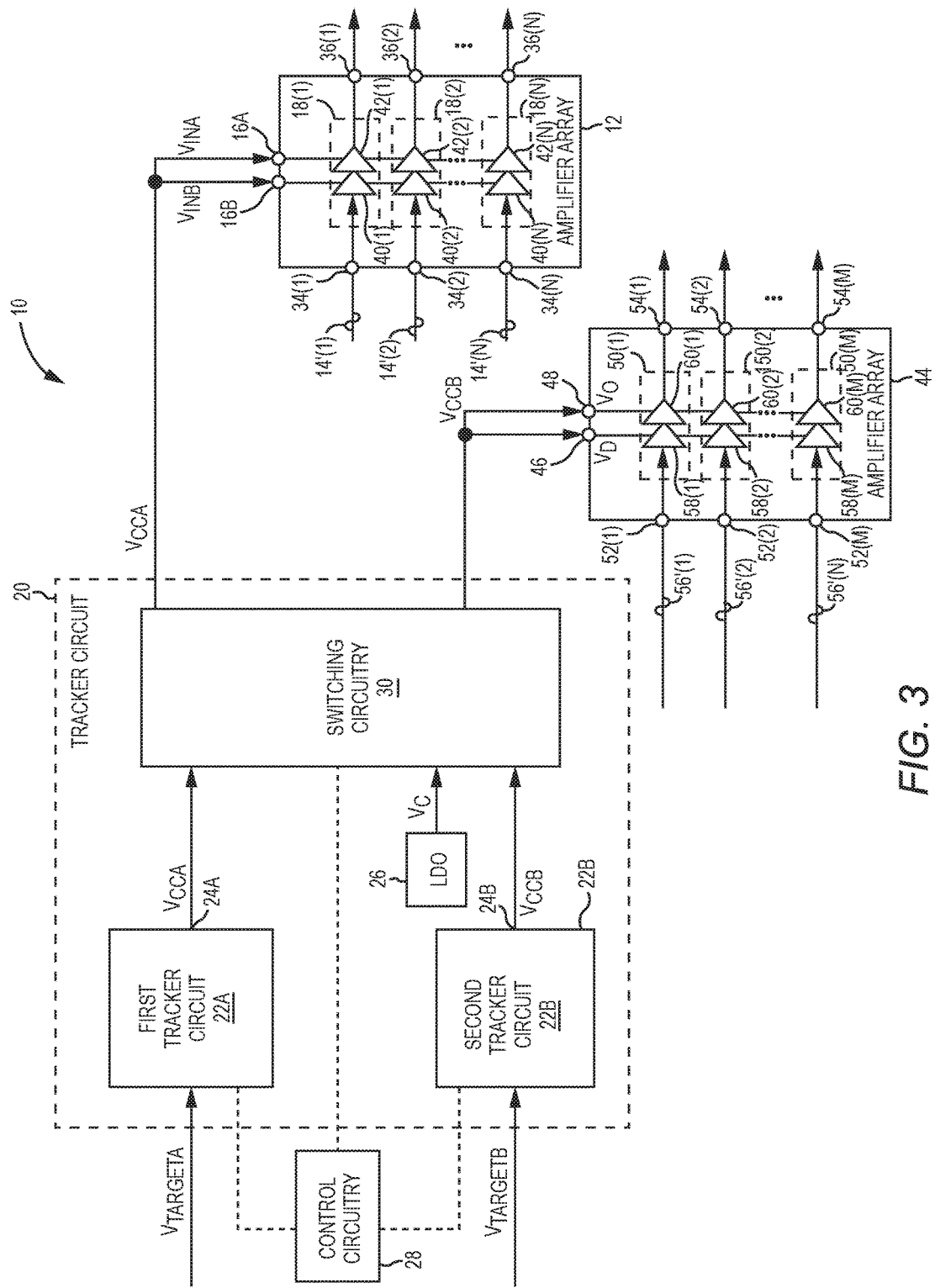
FIG. 3 is a schematic diagram of the mmWave ET circuit of FIG. 1 configured to support multiple antenna arrays according to another embodiment of the present disclosure.

Before discussing the ET circuit that is configured to determine and offset a combined distortion term in a number of RF transmit signals generated by an amplifier array(s), a discussion of the ET circuit configured to support the amplifier array(s) for amplifying an RF signal in a wide range of modulation bandwidth is first provided with reference to FIGS. 1-3. The discussion of specific exemplary aspects of an ET circuit that is configured to determine and offset a combined distortion term in a number of RF transmit signals starts below with reference to FIG. 4.

In this regard, FIG. 1 is a schematic diagram of an exemplary mmWave ET circuit 10 configured to support an amplifier array 12 for amplifying an RF signal 14 in a wide range of modulation bandwidth. The amplifier array 12 includes a first amplifier input 16A and a second amplifier input 16B that are configured to receive a first input voltage $V_{INA}$ and a second input voltage $V_{INB}$, respectively. The amplifier array 12 includes a number of amplifier circuits 18(1)-18(N) that are coupled to the first amplifier input 16A and the second amplifier input 16B. Accordingly, the amplifier circuits 18(1)-18(N) can each amplify the RF signal 14 based on the first input voltage $V_{INA}$ and the second input voltage $V_{INB}$.

The mmWave ET circuit 10 includes a tracker circuit 20, which further includes a first tracker circuit 22A and a second tracker circuit 22B. The first tracker circuit 22A is configured to generate a first modulated voltage $V_{CCA}$ (e.g., ET/APT modulated voltage) at a first tracker output 24A based on a first target voltage $V_{TARGETA}$. The second tracker circuit 22B is configured to generate a second modulated voltage $V_{CCB}$ (e.g., ET/APT modulated voltage) at a second tracker output 24B based on a second target voltage $V_{TARGETB}$, which may be the same as or different from the first target voltage $V_{TARGETA}$. The tracker circuit 20 may include low dropout regulator (LDO) circuitry 26 configured to generate a constant voltage $V_C$.

The mmWave ET circuit 10 includes control circuitry 28, which can be provided as a microprocessor, a microcontroller, a digital signal processor, or a field-programmable gate array (FPGA), for example. As discussed below, the control circuitry 28 can control the first tracker circuit 22A, the second tracker circuit 22B, and/or the LDO circuitry 26 to provide a combination of ET modulated voltage, APT modulated voltage, and/or constant voltage to the first amplifier input 16A and the second amplifier input 16B. More specifically, the control circuitry 28 is configured to couple a selected tracker circuit among the first tracker circuit 22A and the second tracker circuit 22B to the first amplifier input 16A to provide a selected modulated voltage $V_{SEL}$ among the first modulated voltage $V_{CCA}$ and the second modulated voltage $V_{CCB}$ to the amplifier array 12 as the first input voltage $V_{INA}$, while providing a determined voltage $V_{DET}$ to the second amplifier input 16B as the second input voltage $V_{INB}$. In a non-limiting example, the selected modulated voltage $V_{SEL}$ is always an ET modulated voltage, while the determined voltage $V_{DET}$ can be an ET modulated voltage, an APT modulated voltage, or a constant voltage. In examples discussed herein, the control circuitry 28 can provide different kinds of the determined voltage to the second amplifier input 26B based on specific usage scenarios. As such, the amplifier array 12 can amplify the RF signal 14 modulated in a wide range of modulation bandwidth (e.g., up to 800 MHz) without compromising efficiency and/or increasing heat dissipation of the amplifier array 12.

The tracker circuit 20 may include switching circuitry 30 configured to couple the first tracker output 24A, the second tracker output 24B, and the LDO circuitry 26 to the first amplifier input 16A and the second amplifier input 16B. In this regard, the control circuitry 28 may control the switching circuitry to couple the selected tracker circuit to the first amplifier input 16A and to provide the determined voltage to the second amplifier input 16B. It should be appreciated that the switching circuitry 30 can be implemented to carry out the above function based on any type, number, and/or layout of switches.

In one non-limiting example, when the RF signal 14 is modulated at a modulation bandwidth that is less than or equal to 100 MHz (≤100 MHz), the control circuitry 28 is configured to also couple the selected tracker circuit to the second amplifier input 16B to provide the selected modulated voltage $V_{SEL}$ as the second input voltage $V_{INB}$. As such, both the first input voltage $V_{INA}$ and the second input voltage $V_{INB}$ will be provided from the same tracker circuit (either the first tracker circuit 22A or the second tracker circuit 22B) as the ET modulated voltage. The control circuitry 28 may couple the selected tracker circuit to the first amplifier input 16A and the second amplifier input 16B via the switching circuitry 30.

In another non-limiting example, when no amplifier array in the mmWave ET circuit 10 other than the amplifier array 12 is operating, the control circuitry 28 can couple a second selected tracker circuit different from the selected tracker circuit to the second amplifier input 16B to provide a second selected modulated voltage, which is an APT modulated voltage, as the second input voltage $V_{INB}$ (the determined voltage). For example, when the first tracker circuit 22A is chosen to be the selected tracker circuit to generate the first modulated voltage $V_{CCA}$ as an ET modulated voltage and provide the first modulated voltage $V_{CCA}$ to the first amplifier input 16A, the second tracker circuit 22B will be chosen as the second selected tracker circuit to generate the second modulated voltage $V_{CCB}$ as an APT modulated voltage and provide the second modulated voltage $V_{CCB}$ to the second amplifier input 16B. Likewise, when the second tracker circuit 22B is chosen to be the selected tracker circuit to generate the second modulated voltage $V_{CCB}$ as an ET modulated voltage and provide the second modulated voltage $V_{CCB}$ to the first amplifier input 16A, the first tracker circuit 22A will be chosen as the second selected tracker circuit to generate the first modulated voltage $V_{CCA}$ as an APT modulated voltage and provide the first modulated voltage $V_{CCA}$ to the second amplifier input 16B. As such, the amplifier array 12 will receive an ET modulated voltage and an APT modulated voltage as the first input voltage $V_{INA}$ and the second input voltage $V_{INB}$, respectively. The control circuitry 28 may couple the selected tracker circuit and the second selected tracker circuit to the first amplifier input 16A and the second amplifier input 16B, respectively, via the switching circuitry 30.

In another non-limiting example, when the RF signal 14 is modulated at a modulation bandwidth greater than 100 MHz (>100 MHz), the control circuitry 28 can couple the selected tracker circuit to the first amplifier input 16A to provide the selected modulated voltage $V_{SEL}$ as the first input voltage $V_{INA}$. Concurrently, the control circuitry 28 can couple the LDO circuitry 26 to the second amplifier input 16B to provide the constant voltage $V_C$ as the second input voltage $V_{INB}$. The control circuitry 28 may couple the selected tracker circuit and LDO circuitry 26 to the first amplifier input 16A and the second amplifier input 16B, respectively, via the switching circuitry 30.

The RF signal 14 can be amplified simultaneously by the amplifier circuits 18(1)-18(N) for transmission via a number of antennas in a formed RF beam. As is further discussed in FIG. 4 later, when the RF signal 14 is transmitted simultaneously from multiple antennas in the formed RF beam, the RF signal transmitted by different antennas can arrive at a receiver via different propagation paths and thus are subject to different delays and/or attenuations. As such, the RF signal 14 needs to be pre-modulated in a number of phase and amplitude terms to ensure that the RF signal 14 transmitted from multiple antennas will arrive at the receiver concurrently.

In this regard, the mmWave ET circuit further includes a pre-processing circuit 32 for pre-modulating the RF signal 14 into a number of pre-processed RF signals 14'(1)-14'(N) in respective phase and amplitude terms to ensure linear phase coherency at the receiver. As is further discussed in FIGS. 5-8 later, the pre-processing circuit 32 is also configured to generate the first target voltage $V_{TARGETA}$ and the second target voltage $V_{TARGETB}$ for the first tracker circuit 22A and the second tracker circuit 22B, respectively. In addition, the pre-processing circuit 32 is further configured to offset nonlinear phase and amplitude distortion resulting from the amplifier circuits 18(1)-18(N).

With continuing reference to FIG. 1, the amplifier array 12 includes a number of signal inputs 34(1)-34(N) and a number of signal outputs 36(1)-36(N). The amplifier circuits 18(1)-18(N) are provided in parallel between the signal inputs 34(1)-34(N) and the signal outputs 36(1)-36(N), respectively.

The signal inputs 34(1)-34(N) are configured to receive the pre-processed RF signals 14'(1)-14'(N), respectively. The amplifier circuits 18(1)-18(N) receive the pre-processed RF signals 14'(1)-14'(N) from the signal inputs 34(1)-34(N), respectively. After amplifying the pre-processed RF signals 14'(1)-14'(N) based on the first input voltage $V_{INA}$ and the second input voltage $V_{INB}$, the amplifier circuits 18(1)-18(N) provides the pre-processed RF signals 14'(1)-14'(N) to the signal outputs 36(1)-36(N), respectively. The signal outputs 36(1)-34(N), which may be coupled to a number of antennas 38(1)-38(N), are configured to output the pre-processed RF signals 14'(1)-14'(N), respectively.

In a non-limiting example, the amplifier circuits 18(1)-18(N) include a number of driver stage amplifiers 40(1)-40(N) and a number of output stage amplifiers 42(1)-42(N), respectively. As illustrated in FIG. 1, all of the driver stage amplifiers 40(1)-40(N) are coupled to the second amplifier input 16B to receive the second input voltage $V_{INB}$, while all of the output stage amplifiers 42(1)-42(N) are coupled to the first amplifier input 16A to receive the first input voltage $V_{INA}$. Each of the output stage amplifiers 42(1)-42(N) is coupled in series to a respective driver stage amplifier among the driver stage amplifiers 40(1)-40(N). For example, the output stage amplifier 42(1) is coupled in series to the driver stage amplifier 40(1), the output stage amplifier 42(2) is coupled in series to the driver stage amplifier 40(2), and so on.

In this regard, the driver stage amplifiers 40(1)-40(N) receive the pre-processed RF signals 14'(1)-14'(N) from the signal inputs 34(1)-34(N), respectively. After amplifying the pre-processed RF signals 14'(1)-14'(N) based on the second input voltage $V_{INB}$, the driver stage amplifiers 40(1)-40(N) provide the pre-processed RF signals 14'(1)-14'(N) to the output stage amplifiers 42(1)-42(N), respectively. The output stage amplifiers 42(1)-42(N), in turn, amplify the pre-processed RF signals 14'(1)-14'(N) based on the first input voltage $V_{INA}$. Subsequently, the output stage amplifiers 42(1)-42(N) provide the pre-processed RF signals 14'(1)-14'(N) to the signal outputs 36(1)-36(N), respectively.

The mmWave ET circuit 10 can be configured to support multiple amplifier arrays concurrently. In this regard, FIG. 2 is a schematic diagram of the mmWave ET circuit 10 of FIG. 1 configured to support multiple antenna arrays according to one embodiment of the present disclosure. Common elements between FIGS. 1 and 2 are shown therein with common element numbers and will not be re-described herein.

The mmWave ET circuit 10 includes a second amplifier array 44. The second amplifier array 44 includes a driver stage input 46 and an output stage input 48 configured to receive a driver stage voltage $V_D$ and an output stage voltage $V_O$, respectively. The second amplifier array 44 includes a number of second amplifier circuits 50(1)-50(M) each coupled to the driver stage input 46 and the output stage input 48. The second amplifier circuits 50(1)-50(M) are provided in parallel between a number of second signal inputs 52(1)-52(M) and a number of second signal outputs 54(1)-54(M), respectively. The second amplifier circuits 50(1)-50(M) are configured to amplify a second RF signal 56 based on the driver stage voltage $V_D$ and the output stage voltage $V_O$. Similar to the RF signal 14, the second RF signal 56 is pre-modulated into a number of second pre-processed RF signals 56'(1)-56'(M) in respective second phase and amplitude terms to ensure linear phase coherency at the receiver.

In a non-limiting example, the second amplifier circuits 50(1)-50(M) include a number of second driver stage amplifiers 58(1)-58(M) and a number of second output stage amplifiers 60(1)-60(M), respectively. All of the second driver stage amplifiers 58(1)-58(M) are coupled to the driver stage input 46 to receive the driver stage voltage $V_D$, while all of the second output stage amplifiers 60(1)-60(M) are coupled to the output stage input 48 to receive the output stage voltage $V_O$. Each of the second output stage amplifiers 60(1)-60(M) is coupled in series to a respective second driver stage amplifier among the second driver stage amplifiers 58(1)-58(M). For example, the second output stage amplifier 60(1) is coupled in series to the second driver stage amplifier 58(1), the second output stage amplifier 60(2) is coupled in series to the second driver stage amplifier 58(2), and so on.

In this regard, the second driver stage amplifiers 58(1)-58(M) receive the second pre-processed RF signals 56'(1)-56'(M) from the second signal inputs 52(1)-52(M), respectively. After amplifying the second pre-processed RF signals 56'(1)-56'(M) based on the driver stage voltage $V_D$, the second driver stage amplifiers 58(1)-58(M) provide the second pre-processed RF signals 56'(1)-56'(M) to the second output stage amplifiers 60(1)-60(M), respectively. The second output stage amplifiers 60(1)-60(M), in turn, amplify the second pre-processed RF signals 56'(1)-56'(M) based on the output stage voltage $V_O$. Subsequently, the second output stage amplifiers 60(1)-60(M) provide the second pre-processed RF signals 56'(1)-56'(M) to the second signal outputs 54(1)-54(M), respectively.

In a non-limiting example, the control circuitry 28 can couple a selected tracker circuit (e.g., the first tracker circuit 22A) and a second selected tracker circuit (e.g., the second tracker circuit 22B) to the first amplifier input 16A and the output stage input 48, respectively. In this regard, the first tracker circuit 22A generates the first modulated voltage $V_{CCA}$ as an ET modulated voltage and provides the ET modulated voltage $V_{CCA}$ to the first amplifier input 16A as the first input voltage $V_{INA}$. Likewise, the second tracker circuit 22B generates the second modulated voltage $V_{CCB}$ as an ET modulated voltage and provides the ET modulated voltage $V_{CCB}$ to the output stage input 48 as the output stage voltage $V_O$. Notably, the control circuitry 28 can also couple the second tracker circuit 22B to the first amplifier input 16A and couple the first tracker circuit 22A to the output stage input 48. In this regard, the amplifier array 12 receives the ET modulated voltage $V_{CCB}$ as the first input voltage $V_{INA}$ and the second amplifier array 44 receives the ET modulated voltage $V_{CCA}$ as the output stage voltage $V_O$.

When the RF signal 14 and the second RF signal 56 are both modulated at a modulation bandwidth that is greater than 100 MHz (>100 MHz), the control circuitry 28 couples the LDO circuitry 26 to both the second amplifier input 16B and the driver stage input 46. As such, the amplifier array 12 receives the constant voltage $V_C$ at the second amplifier input 16B as the second input voltage $V_{INB}$. Likewise, the second amplifier array 44 receives the constant voltage $V_C$ at the driver stage input 46 as the driver stage voltage $V_D$.

FIG. 3 is a schematic diagram of the mmWave ET circuit 10 of FIG. 1 configured to support multiple antenna arrays according to another embodiment of the present disclosure. Common elements between FIGS. 1, 2, and 3 are shown therein with common element numbers and will not be re-described herein.

In a non-limiting example, the control circuitry 28 can couple a selected tracker circuit (e.g., the first tracker circuit 22A) and a second selected tracker circuit (e.g., the second tracker circuit 22B) to the first amplifier input 16A and the output stage input 48, respectively. In this regard, the first tracker circuit 22A generates the first modulated voltage $V_{CCA}$ as an ET modulated voltage and provides the ET modulated voltage $V_{CCA}$ to the first amplifier input 16A as the first input voltage $V_{INA}$. Likewise, the second tracker circuit 22B generates the second modulated voltage $V_{CCB}$ as an ET modulated voltage and provides the ET modulated voltage $V_{CCB}$ to the output stage input 48 as the output stage voltage $V_O$.

When the RF signal 14 and the second RF signal 56 are both modulated at a modulation bandwidth that is less than or equal to 100 MHz (≤100 MHz), the control circuitry 28 couples the selected tracker circuit (e.g., the first tracker circuit 22A) and the second selected tracker circuit (e.g., the second tracker circuit 22B) to the second amplifier input 16B and the driver stage input 46, respectively. In this regard, the amplifier array 12 also receives the ET modulated voltage $V_{CCA}$ as the second input voltage $V_{INB}$. Similarly, the second amplifier array 44 also receives the ET modulated voltage $V_{CCB}$ as the driver stage voltage $V_D$.

Figure 4:
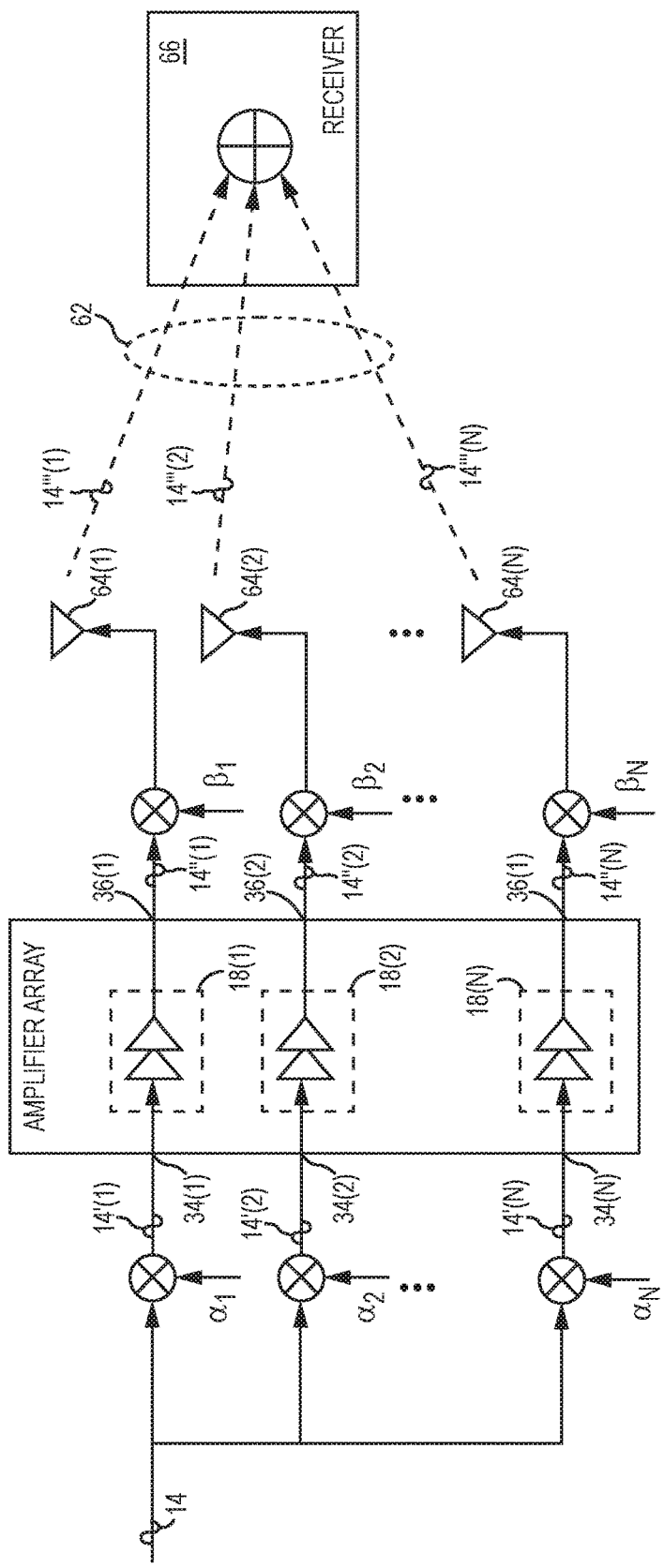
FIG. 4 is a schematic diagram providing an exemplary illustration of the amplifier array of FIG. 1 configured to amplify the RF signal for transmission in a formed RF beam.

As previously discussed in FIG. 1, the RF signal 14 can be amplified simultaneously by the amplifier circuits 18(1)-18(N) for transmission via a number of antennas in a formed RF beam. In this regard, FIG. 4 is a schematic diagram providing an exemplary illustration of the amplifier array 12 of FIG. 1 configured to amplify the RF signal 14 for transmission in a formed RF beam 62. Common elements between FIGS. 1 and 4 are shown therein with common element numbers and will not be re-described herein.

In a non-limiting example, the signal outputs 36(1)-36(N) are coupled to a number of antennas 64(1)-64(N) for transmitting the formed RF beam 62 to a receiver 66. The RF signal 14 may be expressed as $Am(t)*e^{j\phi m(t)}$. According to discussions in FIG. 1, when the RF signal 14 is transmitted simultaneously from the antennas 64(1)-64(N) in the formed RF beam 62, the RF signal can arrive at the receiver 66 via different propagation paths and thus is subject to different delays and/or attenuations. As such, the RF signal 14 needs to be pre-modulated in a number of phase and amplitude terms to ensure that the RF signal 14 transmitted from multiple antennas will arrive at the receiver concurrently. As such, the RF signal 14 is pre-modulated based on first complex terms $\alpha_1$-$\alpha_N$ to generate the pre-processed RF signals 14'(1)-14'(N) in respective phase and amplitude terms to ensure linear phase coherency at the receiver 66. In a non-limiting example, the first complex terms $\alpha_1$-$\alpha_N$ determine respective coefficient gains of the amplifier circuits 18(1)-18(N).

The amplifier circuits 18(1)-18(N) amplify the pre-processed RF signals 14'(1)-14'(N) to generate a number of RF transmit signals 14"(1)-14"(N), respectively. Notably, the amplifier circuits 18(1)-18(N) may be inherently nonlinear and thus can cause phase and amplitude distortions, which may be represented respectively by phase term $\phi AMPM_i$ (1≤i≤N) and amplitude term $AMAM_i$ (1≤i≤N), in the RF transmit signals 14"(1)-14"(N). As such, each of the RF transmit signals 14"(1)-14"(N) may be expressed as:

$$\alpha_i*AMAM_i(t)*e^{j\phi AMPM_i(t)}*Am(t)*e^{j\phi m(t)} \ (1 \leq i \leq N)$$

Furthermore, the antennas 64(1)-64(N) may also cause phase and amplitude changes that may be modeled by second complex terms $\beta_i$ (1≤i≤N), respectively. As such, the receiver 66 may receive a number of RF receive signals 14'''(1)-14'''(N) that can be expressed as:

$$Am(t)*e^{j\phi m(t)}*A_D(t)$$

In the expression above, $A_D(t)$ represents a combined distortion term, which is a complex distortion term including a phase distortion term and an amplitude distortion term, in the formed RF beam 62 received at the receiver 66 and may be represented by the equation below:

$$A_D(t) = \alpha_1*\beta_1*AMAM_1(t)*e^{j\phi AMPM_1(t)} + \ldots + \alpha_N*\beta_N*AMAM_N(t)*e^{j\phi AMPM_N(t)}$$

As such, it is necessary to offset the combined distortion term $A_D(t)$ in the formed RF beam 62 such that the receiver 66 can receive the RF signal 14 in the originally form of $Am(t)*e^{j\phi m(t)}$. As discussed next in FIGS. 5 and 6, it is possible to pre-process the RF signal 14 with a distortion correction term $A_C(t)$, which is a complex correction term, prior to modulating the RF signal 14 into the pre-processed RF signals 14'(1)-14'(N) in the respective phase and amplitude terms. In a non-limiting example, the distortion correction term $A_C(t)$ corresponds to an inverse of the complex combined distortion term $A_D(t)$ (e.g., $A_C(t)=1/A_D(t)$). By inserting the distortion correction term $A_C(t)$ into the RF signal 14 prior to modulating the RF signal 14 for linear phase coherency, it is possible to effectively offset the combined distortion term $A_D(t)$ at the receiver 66 without compromising efficiency of the amplifier array 12. Further, it may be possible to offset the combined distortion term $A_D(t)$ without significantly increasing cost, footprint, and/or complexity of the mmWave ET circuit 10 of FIG. 1 as a whole.

Figure 5:
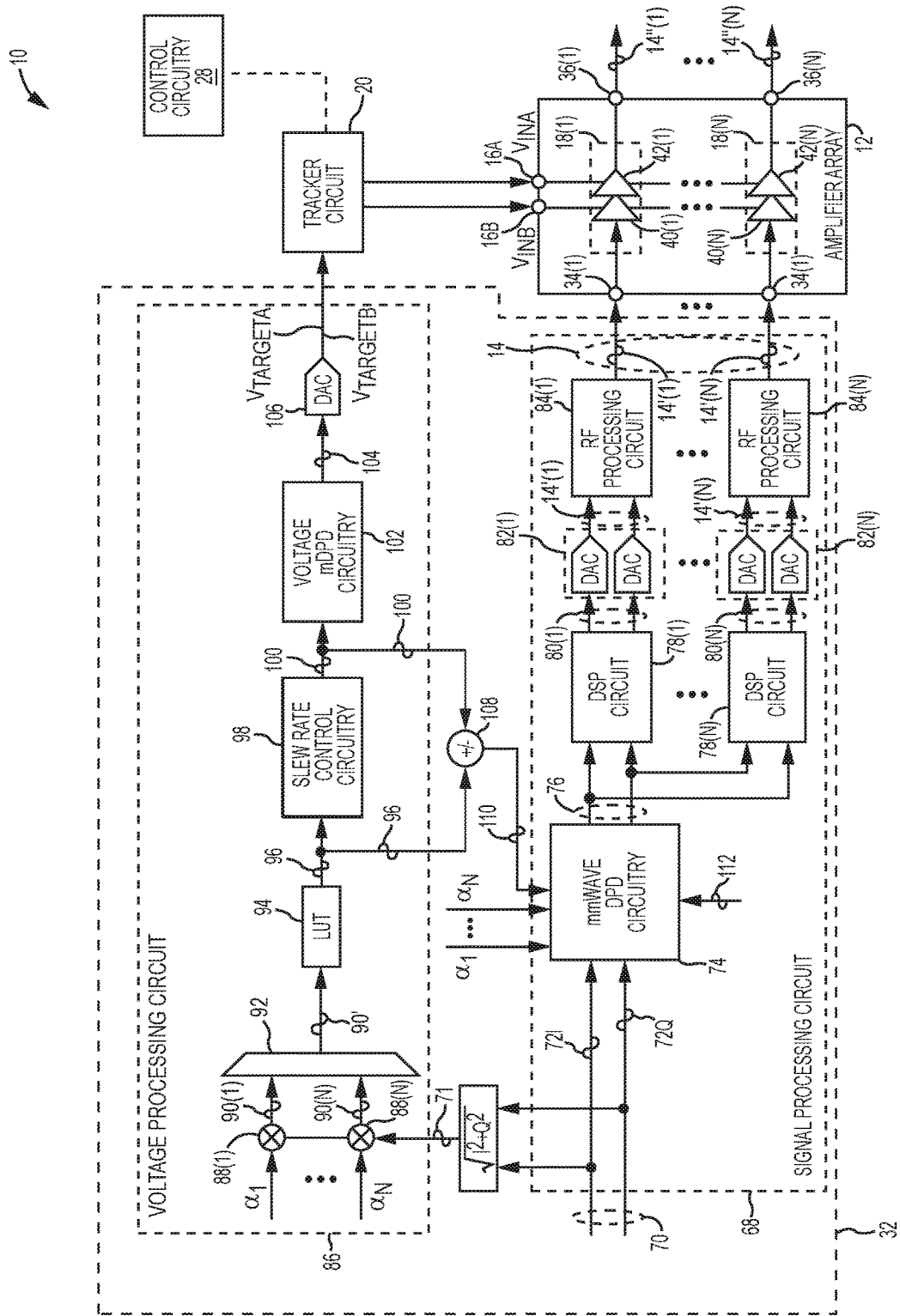
FIG. 5 is a schematic diagram providing an exemplary illustration of the mmWave ET circuit of FIG. 1 configured to reduce phase and amplitude distortions in the RF signal according to one embodiment of the present disclosure.

In this regard, FIG. 5 is a schematic diagram providing an exemplary illustration of the mmWave ET circuit 10 of FIG. 1 configured to reduce phase and amplitude distortions in the RF signal 14 according to one embodiment of the present disclosure. Common elements between FIGS. 1, 4, and 5 are shown therein with common element numbers and will not be re-described herein.

In a non-limiting example, the pre-processing circuit 32 includes a signal processing circuit 68. As discussed in detail below, the signal processing circuit 68 is configured to determine the combined distortion term $A_D(t)$ in the RF transmit signals 14"(1)-14"(N). Accordingly, the signal processing circuit 68 pre-distorts the RF signal 14 with the distortion correction term $A_C(t)$ to offset the combined distortion term $A_D(t)$ in the RF transmit signals 14"(1)-14"(N).

The signal processing circuit 68 is configured to receive a digital signal 70 that includes a number of time-variant signal amplitudes 71 representing a time-variant signal envelope. The digital signal 70 may be modulated to include a digital in-phase signal 72I, which has a number of in-phase amplitudes I, and a digital quadrature signal 72Q, which has a number of quadrature amplitudes Q. In this regard, the time-variant signal amplitudes 71 can be expressed as $\sqrt{I^2+Q^2}$.

Accordingly, the signal processing circuit 68 generates the RF signal 14 based on the digital signal 70. Further, the signal processing circuit pre-modulates the RF signal 14 into the pre-processed RF signals 14'(1)-14'(N) in the respective phase and amplitude terms. Subsequently, the signal processing circuit 68 provides the pre-processed RF signals 14'(1)-14'(N) to the signal inputs 34(1)-34(N) of the amplifier array 12, respectively.

The signal processing circuit 68 includes mmWave digital pre-distortion (DPD) circuitry 74 configured to receive the digital signal 70 including the time-variant signal amplitudes 71. The mmWave DPD circuitry 74 is configured to determine the combined distortion term $A_D(t)$ in the RF transmit signals 14"(1)-14"(N). Accordingly, the mmWave DPD circuitry 74 generates the distortion correction term $A_C(t)$ based on the combined distortion term $A_D(t)$. For example, the mmWave DPD circuitry 74 can generate the distortion correction term $A_C(t)$ to correspond inversely to the combined distortion term $A_D(t)$ ($A_C(t)=1/A_D(t)$). Subsequently, the mmWave DPD circuitry 74 digitally pre-distorts the digital signal 70 to generate a modified digital signal 76 that includes the digital signal 70 and the distortion correction term $A_C(t)$.

The signal processing circuit 68 includes a number of digital signal processing (DSP) circuits 78(1)-78(N) each configured to receive the modified digital signal 76 from the mmWave DPD circuitry 74. The DSP circuits 78(1)-78(N) are configured to modulated the modified digital signal 76 to generate a number of modulated digital signals 80(1)-80(N) in the respective phase and amplitude terms. Notably, the respective phase and amplitude terms are modulated into the modulated digital signals 80(1)-80(N) to achieve linear phase coherency in the formed RF beam 62.

The signal processing circuit 68 includes a number of digital-to-analog converter (DAC) pairs 82(1)-82(N) configured to convert the modulated digital signals 80(1)-80(N) into the pre-processed RF signals 14'(1)-14'(N), respectively. Notably, the pre-processed RF signals 14'(1)-14'(N) correspond to the RF signal 14 modulated in the respective phase and amplitude terms to achieve linear phase coherency in the formed RF beam 62. The signal processing circuit 68 may include a number of RF processing circuits 84(1)-84(N). The RF processing circuits 84(1)-84(N) may perform frequency conversion (e.g., to intermediate frequency or carrier frequency) on the pre-processed RF signals 14'(1)-14'(N) and provide the pre-processed RF signals 14'(1)-14'(N) to the signal inputs 34(1)-34(N), respectively.

The pre-processing circuit 32 includes a voltage processing circuit 86. The voltage processing circuit 86 receives the time-variant signal amplitudes 71 from the signal processing circuit 68. The voltage processing circuit 86 includes a number of modulators 88(1)-88(N) configured to receive the coefficient gains $\alpha_1$-$\alpha_N$ of the amplifier circuits 18(1)-18(N), which were also referred to as the first complex terms $\alpha_1$-$\alpha_N$ in FIG. 4. The modulators 88(1)-88(N) are also configured to modulate the coefficient gains $\alpha_1$-$\alpha_N$ with the time-variant signal amplitudes 71 to generate a number of target signals 90(1)-90(N). Notably, each of the target signals 90(1)-90(N) redefines the time-variant signal amplitudes 71 based on a respective coefficient gain.

The voltage processing circuit 86 includes a logic gate 92 configured to output a selected target signal 90' among the target signals 90(1)-90(N). In a non-limiting example, the logic gate 92 can be configured to output the selected target signal 90' that corresponds to a maximum coefficient gain among the coefficient gains $\alpha_1$-$\alpha_N$.

The voltage processing circuit 86 includes voltage lookup table (LUT) circuitry 94 configured to generate a number of predetermined target voltage amplitudes 96 based on the time-variant signal amplitudes 71 associated with the selected target signal 90'. The voltage processing circuit 86 may include slew rate control circuitry 98 that is coupled to the LUT circuitry 94. The slew rate control circuitry 98 is configured to nonlinearly modify the predetermined target voltage amplitudes 96 to generate a number of time-variant target voltage amplitudes 100 that are greater than or equal to the predetermined target voltage amplitudes 96, respectively.

The voltage processing circuit 86 includes voltage memory DPD (mDPD) circuitry 102. The voltage mDPD circuitry 102 is configured to digitally pre-distort the time-variant target voltage amplitudes 100 to generate a digital target voltage signal 104 having the time-variant target voltage amplitudes 100. The voltage processing circuit 86 includes a voltage DAC 106. The voltage DAC 106 converts the digital target voltage signal 104 into the first target voltage $V_{TARGETA}$ and the second target voltage $V_{TARGETB}$. Notably, each of the first target voltage $V_{TARGETA}$ and the second target voltage $V_{TARGETB}$ has a time-variant target voltage envelope that tracks the time-variant target voltage amplitudes 100.

As mentioned earlier, the slew rate control circuitry 98 is configured to nonlinearly modify the predetermined target voltage amplitudes 96 to generate the time-variant target voltage amplitudes 100 that are greater than or equal to the predetermined target voltage amplitudes 96, respectively. As such, the pre-processing circuit 32 further includes a comparator 108 configured to generate an amplitude comparison signal 110 indicative of differences between the time-variant target voltage amplitudes 100 and the predetermined target voltage amplitudes 96, respectively. In this regard, the amplitude comparison signal 110 may also provide an indication of potential error in modulated voltage (e.g., $V_{CCA}$ or $V_{CCB}$) generated by the tracker circuit 20.

The mmWave DPD circuitry 74 receives the amplitude comparison signal 110 from the comparator 108. The mmWave DPD circuitry 74 also receives the coefficient gains $\alpha_1$-$\alpha_N$. The mmWave DPD circuitry 74 may also receive an indication signal 112 indicative of the phase and amplitude changes of the RF transmit signals 14"(1)-14"(N) caused by the amplifier circuits 18(1)-18(N), which can be modeled by the second complex terms $\beta_i$ ($1 \leq i \leq N$) as discussed earlier in FIG. 4. In a non-limiting example, the mmWave DPD circuitry 74 can be configured to determine the combined distortion term $A_D(t)$ and the distortion correction term $A_C(t)$ based on the error in the modulated voltage, the coefficient gains $\alpha_1$-$\alpha_N$, and the phase and amplitude changes caused by the amplifier circuits 18(1)-18(N).

Figure 6:
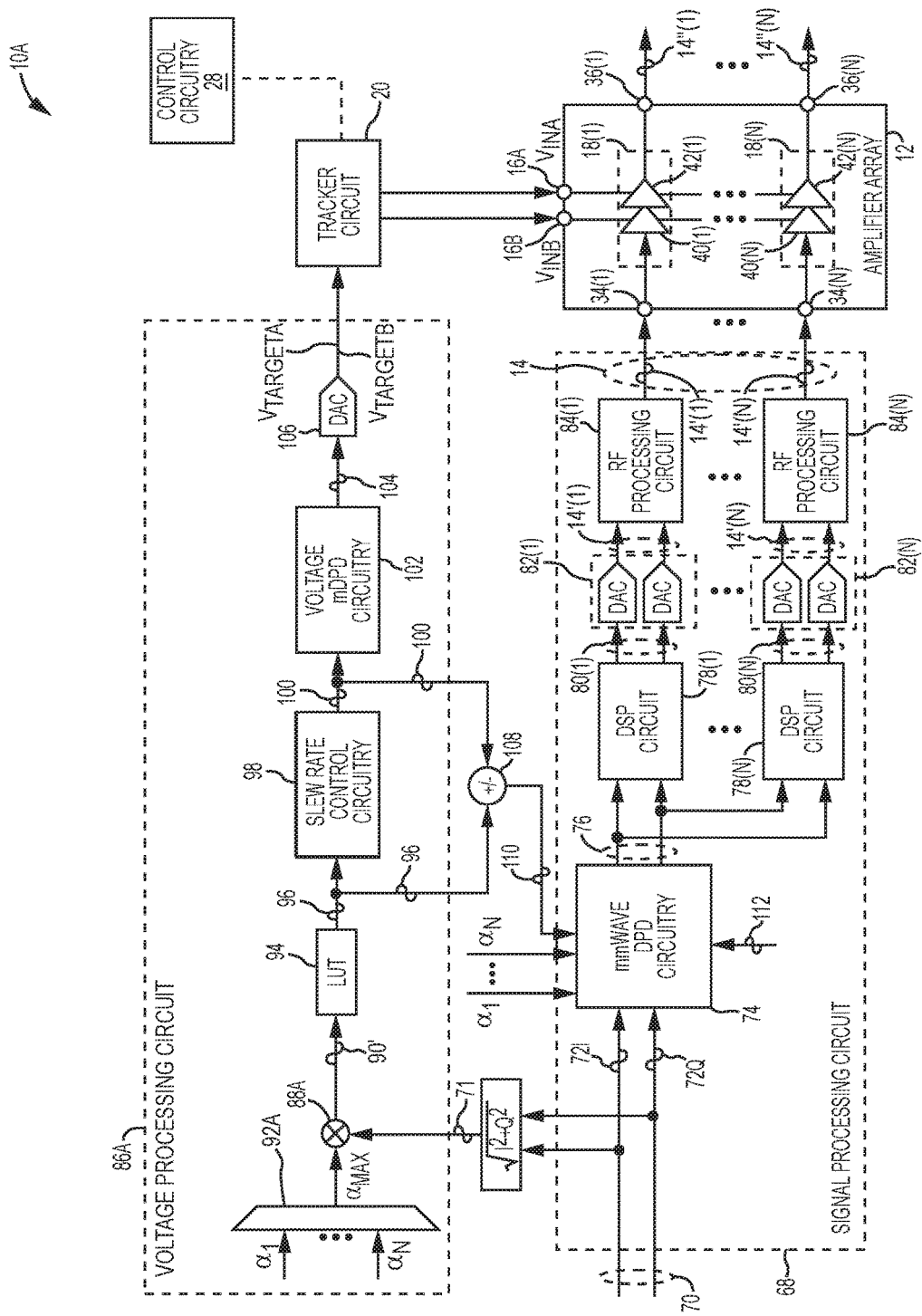
FIG. 6 is a schematic diagram of an exemplary mmWave ET circuit configured to reduce phase and amplitude distortions in the RF signal of FIG. 1 according to another embodiment of the present disclosure.

FIG. 6 is a schematic diagram of an exemplary mmWave ET circuit 10A configured according to another embodiment of the present disclosure to reduce phase and amplitude distortions in the RF signal 14 of FIG. 1. Common elements between FIGS. 1, 5, and 6 are shown therein with common element numbers and will not be re-described herein.

The mmWave ET circuit 10A includes a voltage processing circuit 86A. The voltage processing circuit 86A includes a logic gate 92A configured to receive the coefficient gains $\alpha_1$-$\alpha_N$ and output a maximum coefficient gain $\alpha_{MAX}$ among the coefficient gains $\alpha_1$-$\alpha_N$. The voltage processing circuit 86 includes a modulator 88A configured to modulate the maximum coefficient gain $\alpha_{MAX}$ with the time-variant signal amplitudes 71 to generate the selected target signal 90'.

FIG. 7 is a schematic diagram of an exemplary mmWave ET circuit 10B configured according to another embodiment of the present disclosure to reduce phase and amplitude distortions in the RF signal 14 of FIG. 1. Common elements between FIGS. 1, 5, and 7 are shown therein with common element numbers and will not be re-described herein.

The mmWave ET circuit 10B includes a signal processing circuit 114 and a voltage processing circuit 116. The signal processing circuit 114 includes a number of DSP circuits 118(1)-118(N) and a number of mmWave DPD circuitries 120(1)-120(N). The DSP circuits 118(1)-118(N) are configured to generate the modulated digital signals 80(1)-80(N) in the respective phase and amplitude terms. The mmWave DPD circuitries 120(1)-120(N) are coupled between the DSP circuits 118(1)-118(N) and the DAC pairs 82(1)-82(N), respectively. In contrast to the signal processing circuit 68 in FIG. 5, the mmWave DPD circuitries 120(1)-120(N) generate a number of distortion correction terms $A_C(t)(1)$-$A_C(t)(N)$ for correcting the phase and amplitude distortions resulting from the amplifier circuits 18(1)-18(N), respectively. As such, each of the mmWave DPD circuitries 120(1)-120(N) needs to determine a respective phase and amplitude distortion corresponding to a respective RF transmit signal of the RF transmit signals 14"(1)-14"(N).

The voltage processing circuit 116 includes a number of LUT circuitries 122(1)-122(N) coupled to the modulators 88(1)-88(N), respectively. Each of the LUT circuitries 122(1)-122(N) is configured to generate a number of predetermined target voltage amplitudes 124 for a respective amplifier circuit among the amplifier circuits 18(1)-18(N). Notably, the predetermined target voltage amplitude 124 may be the same or different for each of the amplifier circuits 18(1)-18(N).

A logic gate 92B is configured to output a selected predetermined target voltage amplitudes 124'. The slew rate control circuitry 98 is configured to nonlinearly modify the selected predetermined target voltage amplitudes 124' to generate the time-variant target voltage amplitudes 100 that are greater than or equal to the selected predetermined target voltage amplitudes 124', respectively.

The mmWave ET circuit 10B includes a number of comparators 126(1)-126(N) coupled to the mmWave DPD circuitries 120(1)-120(N), respectively. The comparators 126(1)-126(N) generate a number of amplitude comparison signals 128(1)-128(N), respectively. Each of the amplitude comparison signals 128(1)-128(N) indicates a respective difference between the time-variant target voltage amplitudes 100 and a respective predetermined target voltage amplitude 124. The amplitude comparison signals 128(1)-128(N) are received and used by the mmWave DPD circuitries 120(1)-120(N) to determine the distortion correction terms $A_C(t)(1)$-$A_C(t)(N)$, respectively.

FIG. 8 is a schematic diagram of an exemplary mmWave ET circuit 10C configured to reduce phase and amplitude distortions in the RF signal 14 of FIG. 1 according to another embodiment of the present disclosure. Common elements between FIGS. 6, 7, and 8 are shown therein with common element numbers and will not be re-described herein.

The mmWave ET circuit 10C includes a signal processing circuit 114B. The signal processing circuit 114B includes a number of mmWave DPD circuitries 130(1)-130(N). The mmWave DPD circuitries 130(1)-130(N) are coupled between the DSP circuits 118(1)-118(N) and the DAC pairs 82(1)-82(N), respectively. The mmWave DPD circuitries 130(1)-130(N) receive the coefficient gains $\alpha_1$-$\alpha_N$, respectively. In addition, each of the mmWave DPD circuitries 130(1)-130(N) also receives the time-variant target voltage amplitudes 100. Accordingly, mmWave DPD circuitries 130(1)-130(N) determine the distortion correction terms $A_C(t)(1)$-$A_C(t)(N)$, respectively, based on the time-variant target voltage amplitudes 100 and the coefficient gains $\alpha_1$-$\alpha_N$.

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking (ET) circuit comprising:
   an amplifier array comprising:
   a plurality of signal inputs configured to receive a plurality of pre-processed radio frequency (RF) signals generated from an RF signal and modulated in a plurality of phase and amplitude terms, respectively;
   a plurality of amplifier circuits coupled to the plurality of signal inputs and configured to amplify the plurality of pre-processed RF signals modulated in the plurality of phase and amplitude terms to generate a plurality of RF transmit signals, respectively; and
   a plurality of signal outputs coupled to the plurality of amplifier circuits and configured to output the plurality of RF transmit signals, respectively; and
   a signal processing circuit coupled to the amplifier array and configured to:
   determine a combined distortion term of the plurality of RF transmit signals; and
   pre-distort the RF signal with a distortion correction term to offset the combined distortion term in the plurality of RF transmit signals.

2. The ET circuit of claim 1 wherein the signal processing circuit is further configured to pre-distort the RF signal with the distortion correction term prior to modulating the RF signal to generate the plurality of pre-processed RF signals in the plurality of phase and amplitude terms.

3. The ET circuit of claim 1 wherein the signal processing circuit is further configured to:
   receive a digital signal comprising a plurality of time-variant signal amplitudes representing a time-variant signal envelope;
   generate the plurality of pre-processed RF signals modulated in the plurality of phase and amplitude terms based on the digital signal; and
   provide the plurality of pre-processed RF signals modulated in the plurality of phase and amplitude terms to the plurality of signal inputs of the amplifier array, respectively.

4. The ET circuit of claim 3 wherein the signal processing circuit comprises digital pre-distortion (DPD) circuitry configured to:
   receive the digital signal comprising the plurality of time-variant signal amplitudes;
   determine the combined distortion term of the plurality of RF transmit signals;
   generate the distortion correction term based on the combined distortion term; and
   digitally pre-distort the digital signal to generate a modified digital signal comprising the digital signal and the distortion correction term.

5. The ET circuit of claim 4 wherein the DPD circuitry is further configured to generate the distortion correction term corresponding to an inverse of the combined distortion term.

6. The ET circuit of claim 4 wherein the DPD circuitry is further configured to determine the combined distortion term and the distortion correction term based on coefficient gains of the plurality of amplifier circuits and phase and amplitude changes caused by the plurality of amplifier circuits.

7. The ET circuit of claim 4 wherein the signal processing circuit further comprises a plurality of digital signal processing (DSP) circuits, the plurality of DSP circuits configured to:
   receive the modified digital signal from the DPD circuitry; and
   modulate the modified digital signal to generate a plurality of modulated digital signals in the plurality of phase and amplitude terms.

8. The ET circuit of claim 7 wherein the signal processing circuit further comprises a plurality of signal digital-to-analog converter (DAC) pairs configured to convert the plurality of modulated digital signals into the plurality of pre-processed RF signals modulated in the plurality of phase and amplitude terms.

9. The ET circuit of claim 8 wherein the signal processing circuit further comprises a plurality of RF processing circuits configured to:
perform frequency conversion on the plurality of pre-processed RF signals modulated in the plurality of phase and amplitude terms; and
provide the plurality of pre-processed RF signals modulated in the plurality of phase and amplitude terms to the plurality of signal inputs of the amplifier array, respectively.

10. The ET circuit of claim 4 further comprising a voltage processing circuit configured to:
receive the plurality of time-variant signal amplitudes from the signal processing circuit;
receive a plurality of coefficient gains corresponding to the plurality of amplifier circuits, respectively;
modulate the plurality of time-variant signal amplitudes with the plurality of coefficient gains to generate a plurality of target signals, respectively;
generate a plurality of time-variant target voltage amplitudes based on a selected target signal among the plurality of target signals; and
generate a target voltage having a time-variant target voltage envelope tracking the plurality of time-variant target voltage amplitudes.

11. The ET circuit of claim 10 wherein the selected target signal corresponds to a maximum coefficient gain among the plurality of coefficient gains.

12. The ET circuit of claim 10 wherein the voltage processing circuit comprises voltage lookup table (LUT) circuitry configured to generate a plurality of predetermined target voltage amplitudes based on the selected target signal.

13. The ET circuit of claim 12 wherein the voltage processing circuit further comprises slew rate control circuitry coupled to the voltage LUT circuitry and configured to nonlinearly modify the plurality of predetermined target voltage amplitudes to generate a plurality of target voltage amplitudes greater than or equal to the plurality of predetermined target voltage amplitudes, respectively.

14. The ET circuit of claim 13 wherein the voltage processing circuit further comprises:
memory digital pre-distortion (mDPD) circuitry configured to digitally pre-distort the plurality of target voltage amplitudes to generate a digital target voltage signal comprising the plurality of target voltage amplitudes; and
a voltage digital-to-analog converter (DAC) configured to convert the digital target voltage signal into the target voltage having the time-variant target voltage envelope tracking the plurality of target voltage amplitudes.

15. The ET circuit of claim 10 further comprising:
a tracker circuit comprising:
a first tracker circuit configured to generate a first modulated voltage based on the target voltage; and
a second tracker circuit configured to generate a second modulated voltage based on the target voltage; and
control circuitry configured to:
couple a selected tracker circuit among the first tracker circuit and the second tracker circuit to a first amplifier input of the amplifier array to provide a selected modulated voltage among the first modulated voltage and the second modulated voltage to the first amplifier input; and
provide a determined voltage to a second amplifier input of the amplifier array.

16. The ET circuit of claim 15 wherein the control circuitry is further configured to couple the selected tracker circuit to the second amplifier input to provide the selected modulated voltage to the second amplifier input.

17. The ET circuit of claim 16 wherein the control circuitry is further configured to couple the selected tracker circuit to the first amplifier input and the second amplifier input in response to the RF signal being modulated at a modulation bandwidth less than or equal to 100 MHz.

18. The ET circuit of claim 15 wherein the control circuitry is further configured to couple a second selected tracker circuit different from the selected tracker circuit among the first tracker circuit and the second tracker circuit to the second amplifier input to provide a second selected modulated voltage different from the selected modulated voltage among the first modulated voltage and the second modulated voltage to the second amplifier input.

19. The ET circuit of claim 15 wherein the control circuitry is further configured to provide a constant voltage to the second amplifier input of the amplifier array.

20. The ET circuit of claim 19 wherein the control circuitry is further configured to provide the constant voltage to the second amplifier input in response to the RF signal being modulated at a modulation bandwidth greater than 100 MHz.

* * * * *